United States Patent
Weber (10) Patent No.: US 7,923,330 B2
(45) Date of Patent: Apr. 12, 2011

(54) METHOD FOR MANUFACTURING A SEMICONDUCTOR DEVICE

(75) Inventor: Hans Martin Weber, Bayerisch Gmain (DE)

(73) Assignee: Infineon Technologies Austria AG, Villach (AT)

(*) Notice: Subject to any disclaimer, the term of this patent is extended or adjusted under 35 U.S.C. 154(b) by 569 days.

(21) Appl. No.: 11/866,151

(22) Filed: Oct. 2, 2007

(65) Prior Publication Data
US 2009/0085104 A1    Apr. 2, 2009

(51) Int. Cl.
*H01L 21/336* (2006.01)
*H01L 21/8242* (2006.01)
*H01L 21/334* (2006.01)
*H01L 21/762* (2006.01)

(52) U.S. Cl. ............... 438/270; 438/243; 257/E21.396; 257/E21.553

(58) Field of Classification Search .......... 438/133–140, 438/197, 268, 270–272, 527, 531, 243–249
See application file for complete search history.

(56) References Cited

U.S. PATENT DOCUMENTS

| 6,306,719 B1 * | 10/2001 | Lee ............................... 438/387 |
| 2003/0143790 A1 * | 7/2003 | Wu ............................... 438/197 |
| 2003/0173618 A1 | 9/2003 | Zundel et al. |
| 2005/0242370 A1 | 11/2005 | Weber et al. |

FOREIGN PATENT DOCUMENTS

DE    10345447    5/2005

OTHER PUBLICATIONS

Sze, S. M., "Semiconductor Devices, Physics and Technology," 2nd Edition, Chapter 12, Lithography and Etching, pp. 404-418, (1985, 2002).

* cited by examiner

*Primary Examiner* — Walter L Lindsay, Jr.
*Assistant Examiner* — Calvin Choi
(74) *Attorney, Agent, or Firm* — Dicke, Billig & Czaja, PLLC (57) ABSTRACT

A method for manufacturing a semiconductor device includes providing a semiconductor substrate including a first surface and a second surface which is arranged opposite to the first surface. The semiconductor substrate includes a plurality of trench structures extending from the first surface into the semiconductor substrate. The thickness of the semiconductor substrate is then reduced by removing semiconductor material at the second surface to obtain a processed second surface with exposed bottom portions of the trench structures. At least a first mask is formed on the processed second surface in a self-aligned manner with respect to the bottom portions of the trench structures, and doping regions are formed in the semiconductor substrate between the trench structures.

20 Claims, 9 Drawing Sheets

FIG. 4B

METHOD FOR MANUFACTURING A SEMICONDUCTOR DEVICE

BACKGROUND

During manufacturing of semiconductor devices, such as power devices, doping regions are often formed by implantation. The final doping profile, that is, the spatial variation of the doping concentration in the semiconductor material, of the respective doping regions is influenced by many factors such as implantation dose, implantation energy and thermal processes which the semiconductor device is subjected to during the manufacturing process. For instance, thermal processes cause diffusion of the dopant in the semiconductor material which results in a broadening of the doping regions. On the other hand, thermal processes are required to activate the dopant and to remove crystal damages of the semiconductor material caused by implantation.

During thermal processing, the shape and extension of the doping regions, which are defined by implantation, change. As a consequence, sharp doping transitions are partially softened. Doping regions formed at an early stage of the manufacturing process are subjected to more thermal processing than doping regions formed at a later stage. The "resolution" of the "early" doping regions in lateral and vertical direction is therefore more deteriorated than that of the "late" doping regions.

To reduce the impact of thermal processes attempts have been made to rearrange the sequence of the individual processing steps such that the thermal processes having a high thermal budget are carried out at the beginning of the manufacturing process while processing steps for forming doping regions having sharp transitions are shifted to the end of the manufacturing process. Such re-arrangement of the processing steps is often not possible, such as when the formation of doping areas arranged in the deep volume of the semiconductor material are concerned.

Doping regions arranged in the deep volume of the semiconductor material can be formed by deep implantation. Deep implantation, however, requires large implantation energies and thick implantation masks to reliably cover those portions of the semiconductor material in which no implantation is desired. Moreover, lateral and vertical straggling may cause broadening of the doping profile. Alternatively, the doping regions can be formed by shallow implantation followed by epitaxial formation of a semiconductor layer to bury the doping regions. Since epitaxial formation is typically formed at the beginning of the manufacturing process the thus formed doping regions is subjected to most of the thermal processes.

SUMMARY

According to an embodiment, a method for manufacturing a semiconductor device is provided. The method includes providing a semiconductor substrate having a first surface and a second surface which is arranged opposite to the first surface. The semiconductor substrate includes a plurality of trench structures extending from the first surface into the semiconductor substrate. The thickness of the semiconductor substrate is then reduced by removing semiconductor material at the second surface to obtain a processed second surface with exposed bottom portions of the trench structures. At least a first mask is formed on the processed second surface in a self-aligned manner with respect to the bottom portions of the trench structures, and doping regions are formed in the semiconductor substrate between the trench structures.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

A full and enabling disclosure of the present invention, including the best mode thereof, to one of ordinary skill in the art, is set forth more particularly in the remainder of the specification, including reference to the accompanying figures.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only.

The term "lateral" as used in this specification intends to describe an orientation parallel to the main surface of a semiconductor wafer or die.

The term "vertical" as used in this specification intends to describe an orientation which is arranged perpendicular to the main surface of the semiconductor wafer or die.

Specific embodiments described in this specification pertain to, without being limited thereto, power semiconductor devices and to devices that are controlled by field-effect such as field-effect transistors (FETs) and insulated gate bipolar transistors (IGBTs).

Figure 1:
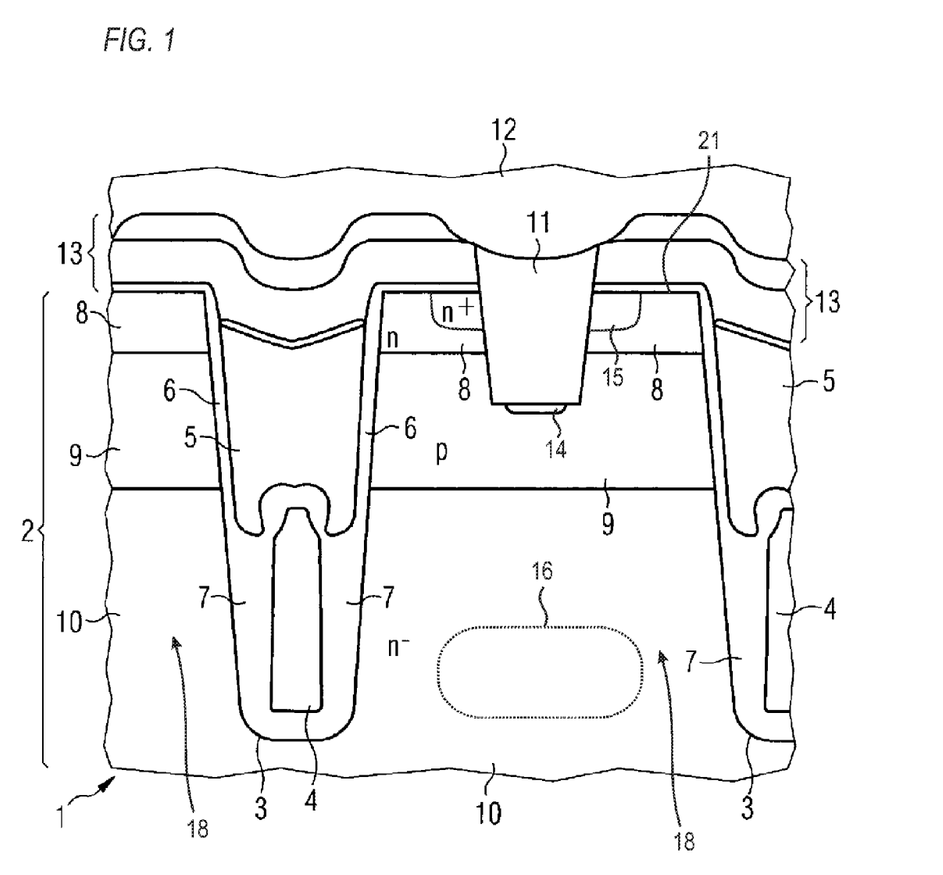
FIG. 1 illustrates a portion of a power semiconductor device including a plurality of trench structures.

FIG. 1 illustrates a detail from a semiconductor device 1, such as a field-effect transistor, which includes a semiconductor substrate 2. The semiconductor substrate 2 includes a semiconductor material such as silicon (Si) or silicon carbide (SiC). The upper portion of the semiconductor substrate can be formed by an epitaxial layer which is deposited on a single-crystalline semiconductor material (lower portion of the semiconductor substrate 2). Epitaxial formation allows for a precise control of the background doping level which strongly influences the breakdown voltage and the on-state resistance Ron of the device. The semiconductor substrate 2 can also include a composite material, for example a SiC-body and a Si-epitaxial layer formed thereon.

A plurality of trenches or trench structures 3 are provided in the semiconductor substrate 2, a field plate 4, a gate electrode 5, a gate dielectric layer 6, for instance an oxide layer, and also a field oxide layer 7 being provided in each case within the trenches 3. The semiconductor material between adjacent trenches is referred to as mesa structure 18. The semiconductor substrate 2 has a plurality of source regions 8, body regions 9 and drift regions 10. The body regions 9 are arranged between the source regions 8 and the drift regions 10. In this embodiment, the drift regions 10 and the source regions 8 are of a first conductivity type while the body regions 9 are of a second conductivity type. FIG. 1 illustrates symbols representing the conductivity type wherein "n" denotes n-type while "p" denotes p-type. The relative doping concentration with respect to a medium doping concentration is indicated by additional "+" and signs. A skilled person will appreciate that the conductivity types can be reversed. As described in more detail below, the trenches 3 projects below the body regions 9 and can deeply penetrate the drift regions 10.

The source and body regions 8, 9 are electrically connected to a front metallization 12 via a highly doped (n++) poly plug 11 and respective body contact regions 14 of the second conductivity type and source contact regions 15 of the first conductivity type which are highly doped to reduce the contact resistance. The gate electrodes 5 are electrically insulated from the metallization layer 12 by an insulation structure 13.

In this embodiment, the drift regions 10 extend mainly in the lower portion of the semiconductor substrate 2 towards a not illustrated lower surface at which a back metallization is formed as set forth in greater detail below. A skilled person will appreciate that a power semiconductor device is formed by a plurality of cell which are electrically connected in parallel. A cell includes one trench 3 and a corresponding source region 8 and body region 9.

During reverse operation, it is desired that the high electrical field mainly drops in the drift regions 10. To this end, the drift regions 10 are not highly doped to reduce the local electrical field strength below a threshold at which an avalanche breakdown occurs. However, a low-doped drift region 10 has a high resistance which significantly contributes to the on-state resistance Ron. Hence, a trade-off between high breakdown voltage and low on-state resistance Ron must be found to obtain balanced and reliable semiconductor devices.

To further improve the breakdown characteristics while keeping the on-state resistance Ron low, the trenches 3 can be arranged in close proximity to each other to shift the location of a possible avalanche breakdown. This allows increasing the doping concentration of the drift regions 10 to reduce the on-state resistance while maintaining the breakdown voltage. This concept is referred to as "dense trench concept" or "dense trench regime". An avalanche breakdown of a dense-trench device occurs remote from the body regions 9 and close to the bottoms of the trenches 3.

Typically, the trenches 3 significantly project over the lower side of the body portions 9 and extend deeply into the drift regions 10 such that they extend, toward a not illustrated second surface, beyond the electrically active region and the electrically active drift region. The term "electrically active region" refers to those portions of the semiconductor substrate 2 in which the electrical field is build up or, in other words, where a significant gradient of the electrical potential occurs. For instance, the electrical potential increase towards a not illustrated back metallization but remains substantially constant close to that back metallization. Typically, a so-called "field stop region" can be formed underneath the drift regions 10 to restrict the spatial extension of the electrical field during reverse conditions. The trenches 3 can extend up to and beyond such a field stop region.

A further reduction of the on-state resistance can be obtained by arranging additional doping regions 16 of the first conductivity type in the drift region 10 between, and in spaced relation to, the trenches 3. The additional doping regions 16 are also spaced from the body regions 9. For reducing the on-state resistance Ron, the additional doping regions 16 have a higher doping concentration than the drift region 10, which form the semiconductor material surrounding the additional doping regions 16. In other words, the additional doping regions 16 are embedded in the drift regions 10. Typically, the drift regions 10 have a doping concentration from about $1*10^{15}/cm^3$ to about $1*10^{18}/cm^3$. The additional doping regions 16 have a doping concentration which exceeds this "background doping" by a factor from about 1.1 to about 10 and in many applications by a factor from about 1.1 to about 3. The actual doping concentration in both the drift regions 10 and the additional doping regions 16 depends on the desired blocking voltage of the device and the lateral spacing of the trenches. The surface charge density of the devices in lateral direction, however, is typically the same for different devices and ranges from about $10^{10}/cm^2$ to about some $10^{12}/cm^2$.

An avalanche breakdown is tolerable if it does not affect structural or functional elements of the semiconductor device. In addition to the reduced on-state resistance Ron, the increase doping concentration of the additional doping regions 16 also increases the likelihood that an avalanche breakdown occurs in the bulk of the drift region 10 remote from the trenches and thus also contributes to the breakdown robustness and reliability of the semiconductor device. By shifting the location of a possible avalanche breakdown from the trench structures 3 towards the centre of the mesa structures 18, the adverse influence of the breakdown on the field oxide layer 7 and other structures of the trenches 3 are reduced. The effects of the additional doping regions 16 are noticeable in connection with devices of the dense-trench-concept. Therefore, the exemplary semiconductor devices as described herein are of the dense-trench-type.

For this purpose, the additional doping regions 16 are arranged in a significant depth with respect to an upper or first surface 21. To maintain their attributes, the shape, size, extension and doping level of the additional doping regions 16 should be well defined. It is therefore desired to reduce the influence of thermal processes on the additional doping regions 16. To avoid adverse effects of thermal processes performed during the manufacturing of the semiconductor device, the additional doping regions 16 are typically manufactured at a late stage. In the following description, examples of suitable manufacturing methods are exemplified.

FIGS. 2A to 2H illustrate a first embodiment of a method for manufacturing a semiconductor device having an additional doping region as described above.

Figure 2A:
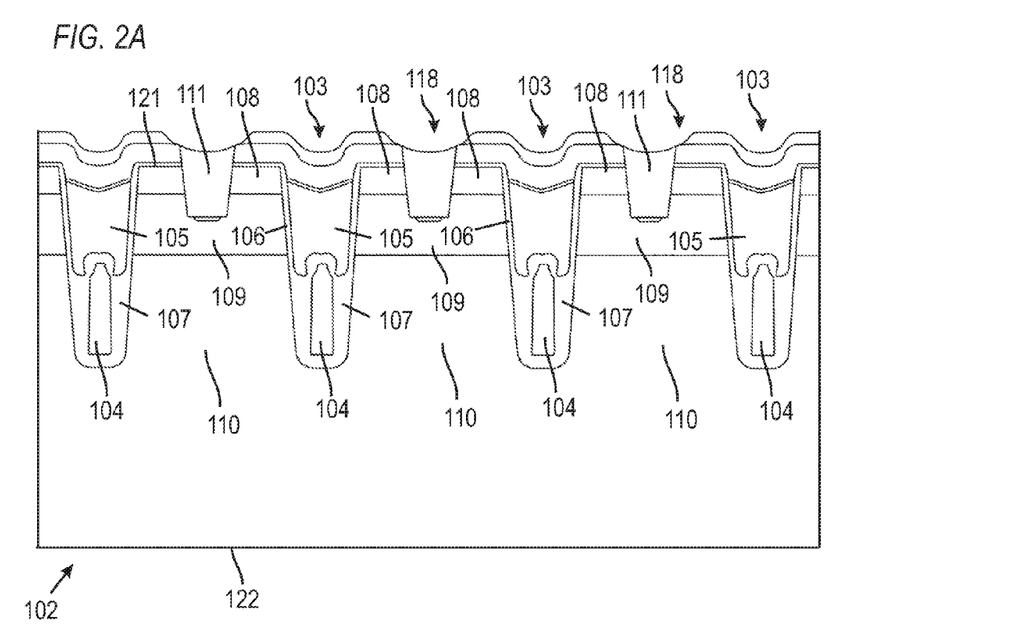
FIGS. 2A to 2H illustrate processing steps of a manufacturing method according to a first embodiment.

A semiconductor substrate 102 is provided which includes a first surface 121 and a second surface 122 which is arrange opposite to the first surface 121. The semiconductor substrate 102 in this embodiment includes Si and includes a single-crystalline semiconductor body and an epitaxial layer formed thereon. The exposed surface of the semiconductor body forms the second surface 122 while the exposed surface of the epitaxial layer forms the first surface 121.

A plurality of trench structures 103 are formed in the semiconductor substrate 102 in a laterally spaced relation to each other. The trench structures 103 extend from the first surface 121 into the semiconductor substrate 102 towards the second surface 122; hence, the trench structures 103 are vertically arranged. The trench structures 103, however, do not extend up to the second surface 122 and a significant portion of the semiconductor substrate 102 remains between bottoms 124 of the trench structures 103 and the second surface 122. Typically, the semiconductor substrate 102 can have an initial thickness which is at least slightly larger than the trench depth and can be up to some 100 µm, for example 500 µm to about 900 µm. The depth of trench structures 103 depends on the desired blocking voltage. The trench structures 103 can have a typical depth of about 2 µm for a reverse bias voltage application of about 20V (so-called "low-voltage devices") and can reach about 100 µm for devices having a blocking voltage in the range of kV (so-called "high-voltage devices"). For many low-voltage devices having a blocking voltage in the range from about 20V to about 100V, the vertical extension of the trench structures 103 can be in the range from about 2 µm to about 20 µm or to about 30 µm.

Each trench structure 103 includes a field plate 104 arranged in a lower portion of the trench structures 103. In the context of this description, "lower" means towards or close to the second surface 122 while "upper" means towards or close to the first surface 121. The respective field plates 104 are insulated from the semiconductor substrate 102 by a respective insulating layer which is typically a field oxide layer 107.

Above the field plates 104, and insulated therefrom, gate electrodes 105 are arranged in a similar manner as described in connection with FIG. 1. The gate electrodes 105 are insulated from the semiconductor substrate 102 by a gate dielectric layer 106 which is thinner than the field oxide layer 107.

Similar as described in connection with the device of FIG. 1, body regions 109 are arranged in the upper portion of the semiconductor substrate 102 while drift regions 110 are arranged in the bottom portion of the semiconductor substrate 102. Body regions 109 and drift regions 110 form respective pn-junctions. In this embodiment, the drift regions 110 are of the n-type (first conductivity type) while the body regions are of the p-type (second conductivity type).

The gate electrodes 105 are arranged close to the body region to allow formation of respective conductive channels when an appropriate voltage exceeding a given threshold is applied to the gate electrodes 105. Different thereto, the field plates 104 are arranged close to the drift regions 110 to influence the distribution of the electrical potential during reverse state. The field plates 104 cause that a significant portion of the isoelectric or equipotential lines of the electrical potential runs through the comparably thick field oxide 107 substantially parallel to the field plates 104. Therefore, the trenches "extend" through those portions of the drift regions 110 at which the reverse electrical field mainly drops.

In addition to the structural and functional features describes above the semiconductor substrate 102 may also include n-type source regions 108, a front metallization 112, body and source contact regions and poly plugs 111 for contacting the body and source regions 109 and 108, respectively. Source regions 108, body regions 109 and plugs 11 are arranged in the mesa structures 118 which are formed between respective adjacent trench structures 103.

After forming the above described structures, additional doping regions in the drift regions between the trench structures 103 are formed. Alternatively, the front metallization can be formed subsequently to the formation of the additional doping regions. Typically, all doping regions and structures at or close to the first surface 121 are formed prior to the formation of the additional doping regions to avoid impact of the thermal processes performed during formation of the front structures on the additional doping regions. In the following, the additional doping regions are referred to as doping regions for the sake of simplicity.

In a first process, the semiconductor substrate 102 is thinned at its second surface 122 by removing portions of the semiconductor material. Typically, the second surface 122 is chemical-mechanical polished (CMP) to thereby reduce the thickness of the semiconductor substrate 102. The CMP-process is carried out selectively to the material of the field oxide layer 107 and therefore stops at the bottoms 124 of the trench structures 104. The bottoms 124 will therefore be exposed. In case of Si as material for the semiconductor substrate 102, a slurry including Tetra-Methyl-Ammonium-Hydroxide as chemical component and quartz or cerium oxides as mechanical component can be used.

Figure 2B:
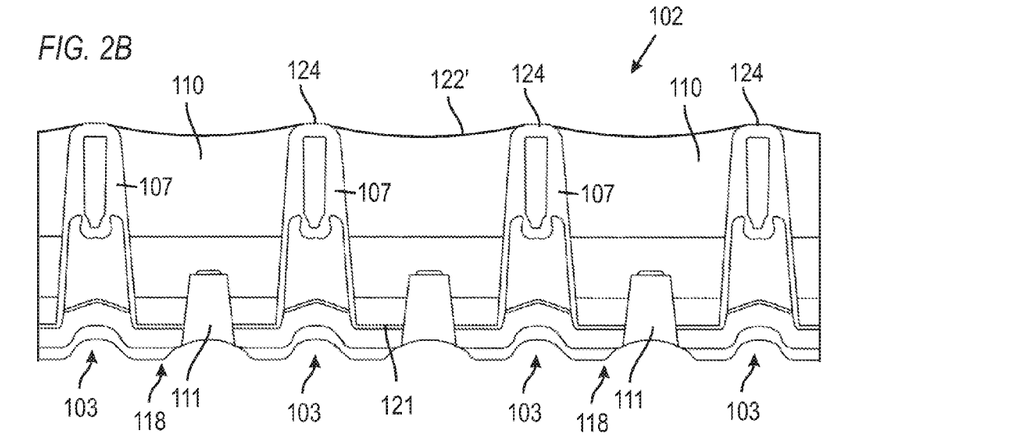

The resulting structure is illustrated in FIG. 2B. For reasons of simplicity, the semiconductor substrate 102 is illustrated upside down in the FIGS. 2B to 2H; hence, the first surface 121 is now on the lower side while the second surface 122 is on the upper side. Since the second surface 122 has been processed, this surface is referred to as processed second surface 122'. As illustrated in FIG. 2B, the bottoms 124 of the trench structures 104 are exposed on the processed second surface 122'.

Figure 2C:
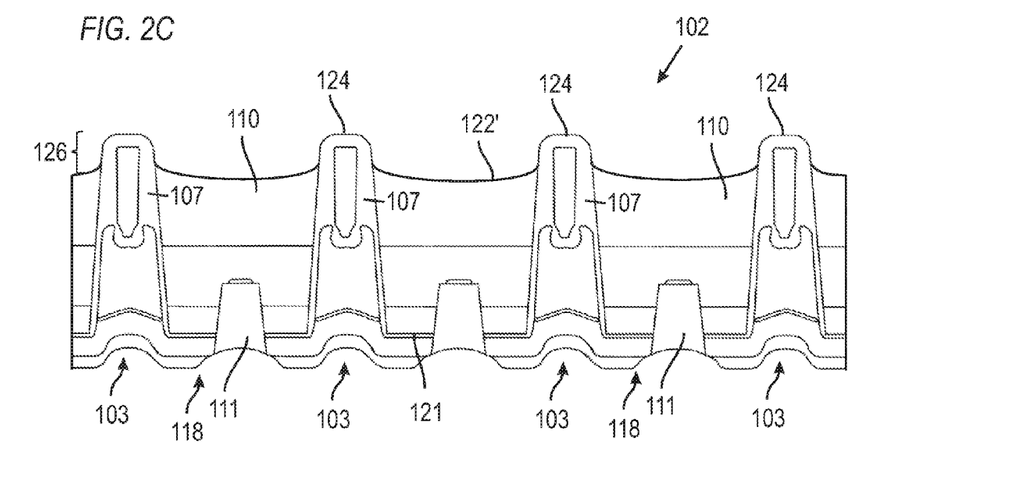

Turning now to FIG. 2C, the semiconductor material of the semiconductor substrate 102 is selectively etched at the processed second surface 122' with respect to the material of the field oxide layer 107 of the trench structures 103 resulting in a further reduction of the thickness of the semiconductor substrate 102. As a consequence, bottom portions 126 of the trench structures 103 are exposed. The bottom portions 126 have a given length and project above the processed second surface 122'. The length of the bottom portions 126 can be adjusted by choosing the appropriate the etching time. Typically, the exposed bottom portions 126 have a length, measured from the processed second surface 122' to the bottoms 124 of the trench structures 103, from about some 10 nm, for example starting from about 30 nm to about 40 nm, up to about 5 µm. The deeper the trench structures 103 the larger is generally the length of the exposed bottom portions 126.

Figure 2D:
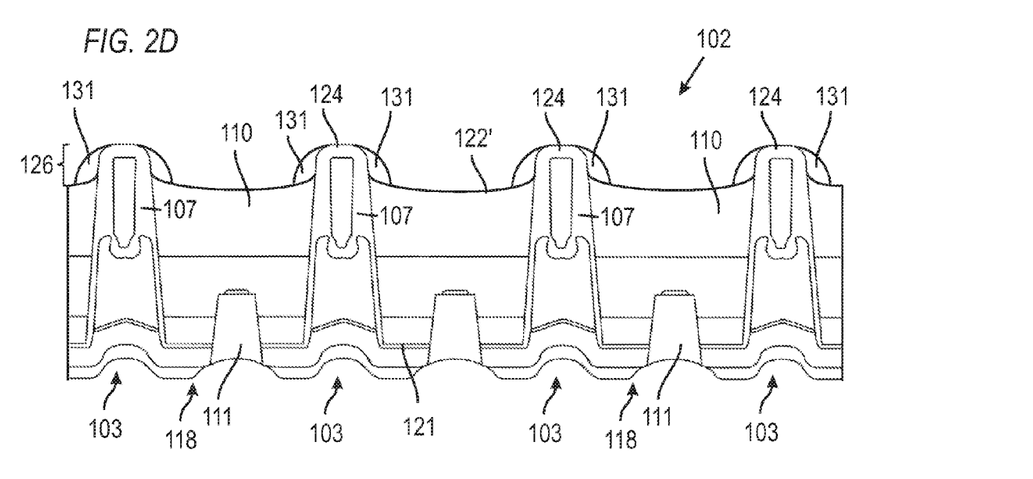

In a subsequent process, a mask layer is deposited. Typically, the mask layer includes a material which can be etched selectively with respect to the material of the semiconductor substrate 102 and the material of the field oxide layers 107. In case of Si as material for the semiconductor substrate 102 and silicon oxide as material of the field oxide layers 107, silicon nitride can be used for the mask layer. With an anisotropic etching process, the mask layer is etched selectively with respect to the semiconductor substrate 102 and the field oxide layers 107 to form spacers 131 at the sidewall of the exposed bottom portions 126 of the trench structures 103. The spacers 131 form a first mask 131 which is formed in a self-aligned manner with respect to the trench structures 107 since no lithographical definition was required. Since the trench structures 103 are aligned with structures and doping regions in the upper portion of the semiconductor substrate 102, the first mask 131 is therefore also aligned with respect to these structures and doping regions. The resulting structure is illustrated in FIG. 2D.

Alternatively, a resist mask can be formed and lithographically structured instead of the spacers 131. This, however, requires alignment of the reticle, used for lithographical exposure, with the trench structures 103 by other means, such as alignment marks. Furthermore, a resist mask needs to have a significant thickness to function as a reliable implantation mask. Therefore, the first mask 131 is typically a hard mask which can be made comparable thin to allow high resolution implantation.

Figure 2E:
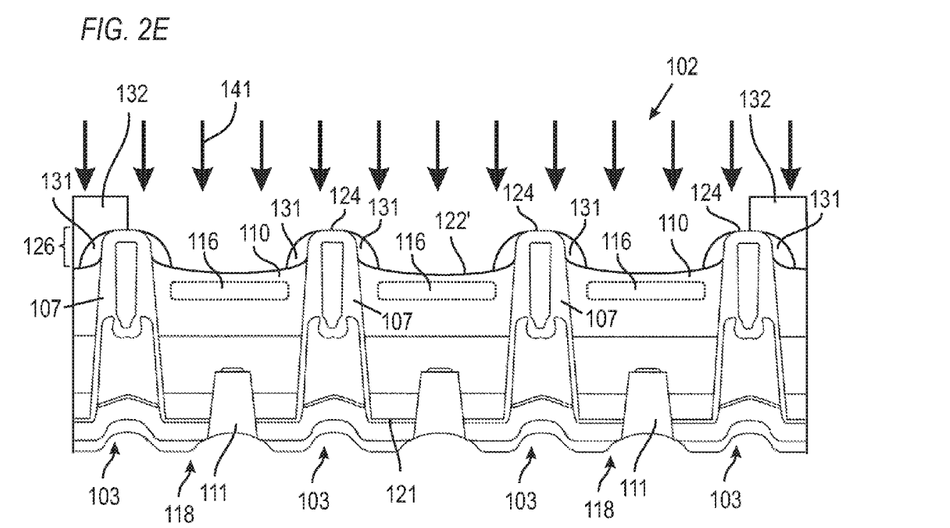

As illustrated in FIG. 2E, an optional second mask 132 can be formed on processed second surface 122'. Typically, the second mask 132 is a resist mask for covering selected portions of the semiconductor substrate 102. The purpose of the second mask is to protect the selected portions during implantation of the doping regions into the central portion of the semiconductor substrate 103, where the cells of the power device are arranged. The selected portions can include at least one of peripheral portions of the device or the semiconductor substrate 102, portions within the cell field, which should not be doped, or both. The second mask 132 can be lithographically structured.

A first dopant 141 is then implanted into the processed second surface 122' using the first and second mask 131, 132 as implantation masks. If no second mask 132 was formed, only the first mask 131 is used. The implantation of the first dopant 141 is also illustrated in FIG. 2E.

The first dopant 141 is of the first conductivity type (in this embodiment n-type) and for example phosphorous, arsenic or antimony. The dose used is typically in the range from about $1*10^{11}/cm^2$ to about $1*10^{13}/cm^2$ at an implantation energy from about some keV to about 100 keV or larger to have mainly a shallow implantation. This results in the formation of doping regions 116 of the first conductivity type in the drift regions 110 close to the processed second surface 122'. The resulting doping concentration will be in the range given in connection with FIG. 1.

Due to the first mask 131 (spacers 131), the doping regions 116 are laterally spaced to the trench structures 103 by a distance which roughly corresponds to the lateral thickness of the spacers 131. The lateral thickness of the spacers 131 is mainly defined by the thickness of the mask layer which was deposited and selectively etched to form the first mask 131. By controlling the thickness of the mask layer, the thickness of the spacers 131 and therefore the lateral distance of the doping regions 116 from the trench structures 103 can be adjusted.

The lateral distance between adjacent trench structures 103 is typically in the range from about 0.1 µm up to about some µm. In case of narrowly spaced trench structures 103 the spacer 131 can assume a lateral width in the range of some 10% of the lateral distance between adjacent trench structures. For illustration purposes, the spacers 131 of trench structures 103 having a lateral distance of about 100 nm can have a lateral width or thickness of about 20 nm. Different thereto, the lateral width of the spacers 131 relative to the lateral distance of adjacent trench structures 103 is typically only in the range of some % of that distance for widely spaced trench structures 103. The resulting lateral distance of the doping regions 116 from adjacent trench structures 103, that is, the sidewalls of the trench structures 103, are typically in the range from about 20 nm to about some few hundreds nanometres. In case of "dense-trench" devices the lateral dimensions are shrunken in comparison to devices for which the avalanche breakdown occurs in or close to the body regions.

The vertical extension of the doping regions 116 depends, inter alia, from the implantation dose used. Typically, the vertically extension is in the range from about few 10 nm to about some 100 nm. Moreover, the doping regions 116 are formed in proximity to the processed second surface 122'. This means that the doping regions 116 are either arranged at the processed second surface 122' or vertically spaced to it by a given small distance, which is typically in the range from about few 10 nm to about some 100 nm. On the other hand, the doping regions 116 are significantly spaced from the lower edge of the body regions and have a vertical distance thereto from about 1 µm for low-voltage devices to about some 10 µm for high voltage devices.

Figure 2F:
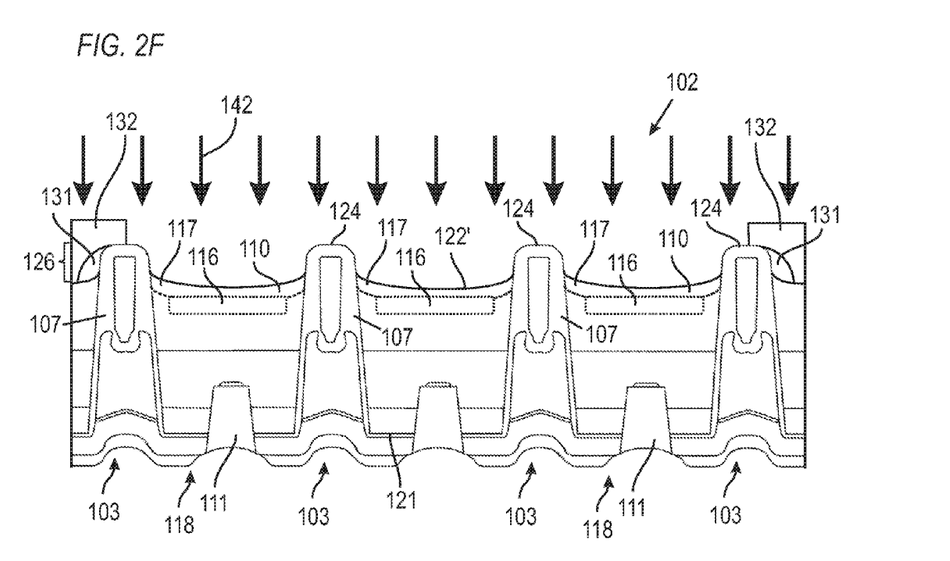

Subsequently, the first mask 131 is removed. This can be done selectively with respect to the second mask 132 as illustrated in FIG. 2F to keep the selected portions of the semiconductor substrate 102 covered by the second mask 132. Alternatively, both the first and the second masks 131 and 132, respectively, can be removed.

A second dopant 142 of the first conductivity type can then be implanted into the processed second surface 122' to form field stop regions 117 at the processed second surface 122'. A typical implantation dose for forming the field stop regions 117 is in the range from about $1*10^{13}/cm^2$ to about $1*10^{16}/cm^2$ with an implantation energy from about some keV to about 100 keV. This results in a doping concentration which is significantly larger than the doping concentration of the drift regions 110. The resulting structure is illustrated in FIG. 2F.

If an IGBT is desired, a third dopant of the second conductivity type can be implanted additionally or alternatively into the processed second surface 122' to form emitter regions at the processed second surface 122'.

Subsequently, defects caused by implantation are annealed using a thermal annealing process which also activates the implanted dopants. Typically, the annealing process is a RTP process (rapid thermal annealing). Optionally, respective annealing processes could be performed after each implantation. However, to reduce the thermal budget, a common annealing process is desired.

Figure 2G:
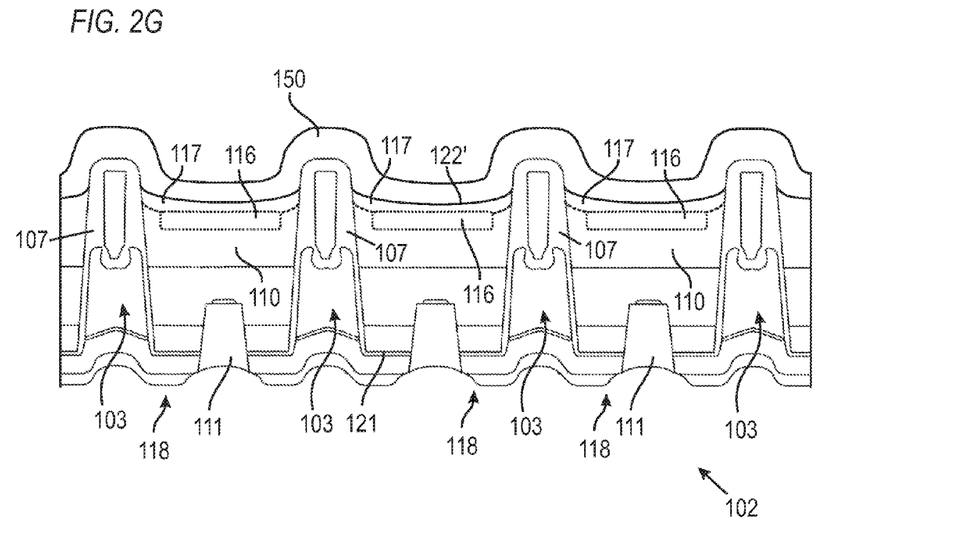

As illustrated in FIG. 2G, a back metallization 150 is formed on the processed second surface 122' to provide an electrical contact. The back metallization 150 electrically connects the separate cells of the power device in parallel. Suitable materials for the back metallization 150 are aluminium or silicides such as TiSi which are deposited for instance by a sputtering process.

Alternative to the sequence describe above, the thermal annealing process can be performed after formation of the back metallization 150.

Figure 2H:
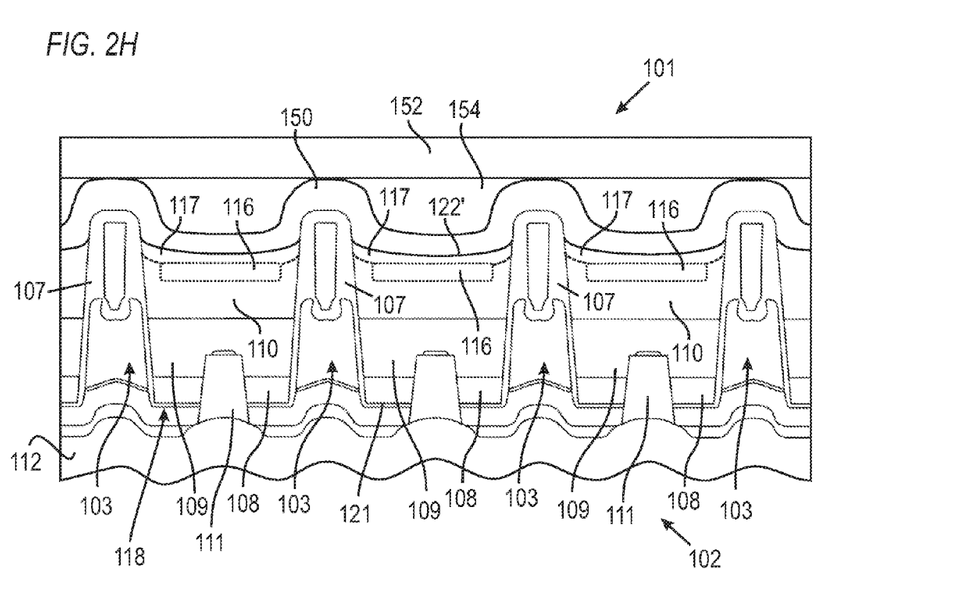

For completing the power semiconductor device 101, the semiconductor substrate 102 is soldered at its back metallization 150 to a lead frame 152 by using an appropriate solder 154. The resulting structure is illustrated in FIG. 2H which also illustrates the front metallization 112 for contacting source and body regions 108 and 109, respectively, through poly plugs 111 as described above. The front metallization 112 can also be formed at the end of the manufacturing process, that is, after formation of the doping regions 116 and the optional field stop region 117. Alternatively, the front metallization 112 can be formed prior to the process for reducing the semiconductor substrate's thickness.

As it becomes apparent from FIG. 2H, the trench structures 103 extend from the first surface 121 into the semiconductor substrate 102 such that the bottom portions 126 of the trench structures 103 project above the processed second surface 122' of the semiconductor substrate 102. Hence, the semiconductor substrate 102 is completely penetrated by the trench structures 103. Further, the doping regions 116 are arranged in the semiconductor substrate 102 in spaced relation to, and between, the trench structures 103.

In connection with FIGS. 3A with 3D another embodiment will be described. The main difference between the embodiment of FIGS. 2A to 2H and this embodiment is that the first mask is used as an etching mask to partially etch the semiconductor material at the processed second surface to form local recesses. To avoid repetition, features corresponding to features in FIGS. 2A to 2H are denoted by like reference numerals and the corresponding description will be omitted.

Figure 3A:
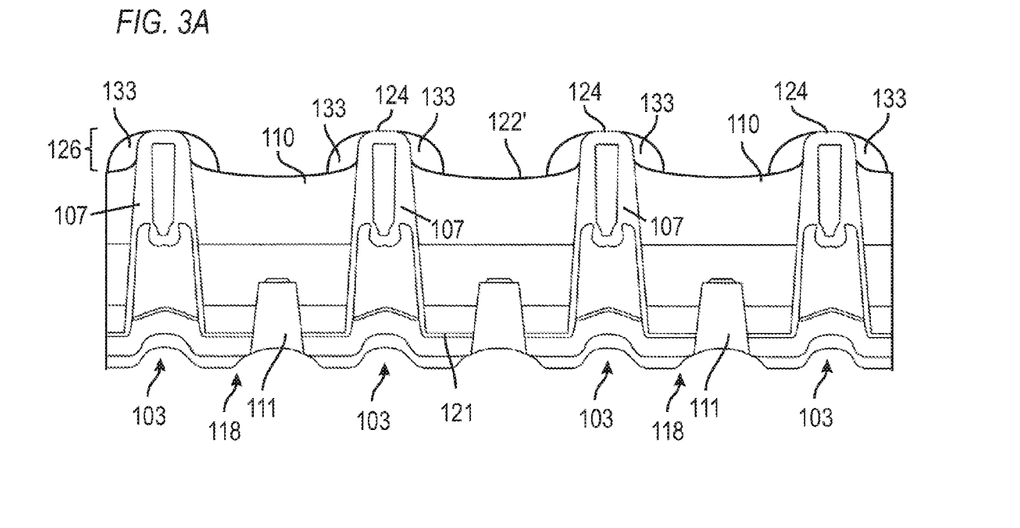
FIGS. 3A to 3D illustrate processing steps of a manufacturing method according to a second embodiment.

Turning to FIG. 3A, the semiconductor substrate 102 is thinned at its second surface 122 to expose bottom portions 126 of the trench structures 103, and a hard mask 133 (corresponds to first mask 131 in FIG. 2D) is formed on the exposed sidewalls of the bottom portions 126 in a self-aligned manner similar to the process illustrated in FIGS. 2A to 2D.

Figure 3B:
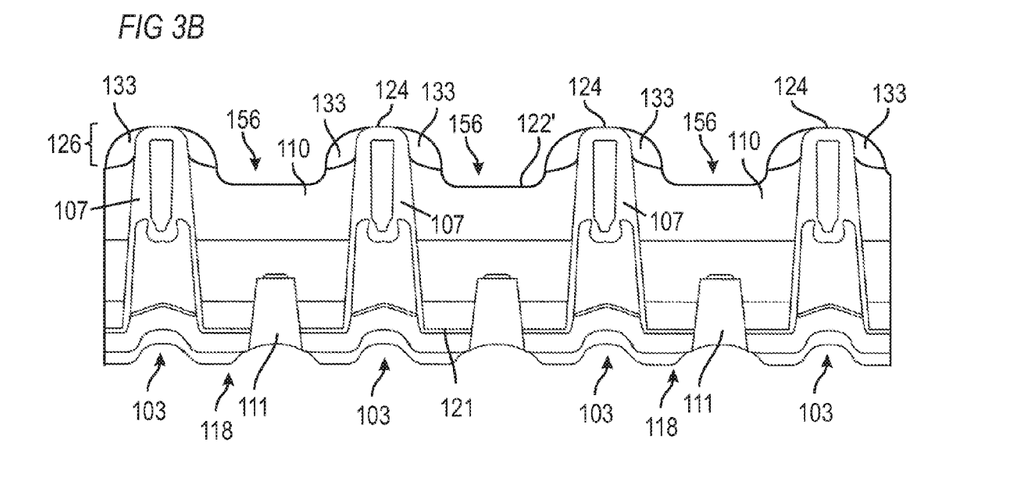

The semiconductor material of the semiconductor substrate 102 is then etched selectively with respect to the hard mask 133 at the processed second surface 122'. The etching is anisotropic. In case of Si as material of the semiconductor substrate 102, an etchant including $Cl_2$ and HBr can be used. The etching results in the formation of recesses 156 at the processed second surface 122'. The lateral extension of a single recess 156 is defined by the spacing of adjacent trench structures 103 and the lateral thickness of the spacers 131 forming the hard mask 133. The lateral distance to adjacent trench structures 103 is mainly defined by the lateral thickness of the spacers of the hard mask 133. The vertical extension of the recesses 156 or its depth can be adjusted by the etching time. Typically, the lateral extension and the depth of the recesses 156 are comparable with respective values given above for the doping regions 116. The resulting structure is illustrated in FIG. 3B.

Figure 3C:
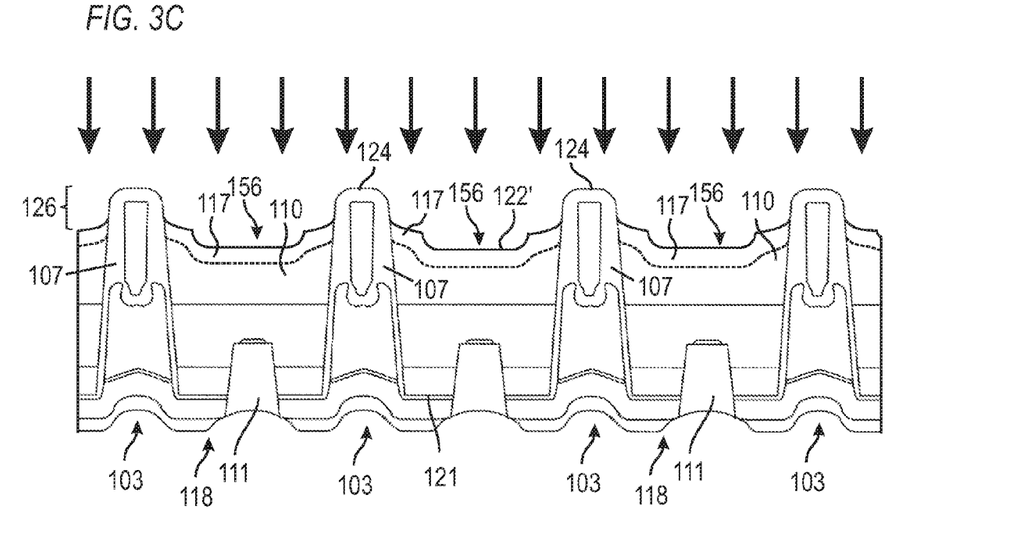

In a subsequent process, a dopant 142 (corresponding to the second dopant 142 in FIG. 2F) is implanted into the processed second surface 122' after removal of the hard mask 133. Alternatively, the dopant 142 can be implanted without removal of the hard mask 133. The same implantation dose and energy as described above in connection with the implantation of the second dopant (FIG. 2F) can be used. The resulting doping regions forming again field stop regions 117 are illustrated in FIG. 3C.

From a functional point of view, those portions of the field stop regions 117 which are formed in the recesses 156 have substantially the same effect as the doping regions 116 of FIGS. 2A to 2H. These portions significantly reduce the on-state resistance Ron and shift the location of a possible avalanche breakdown from the trench structures 103 to a centre portion of the drift region arranged between adjacent trench structures 103.

Figure 3D:
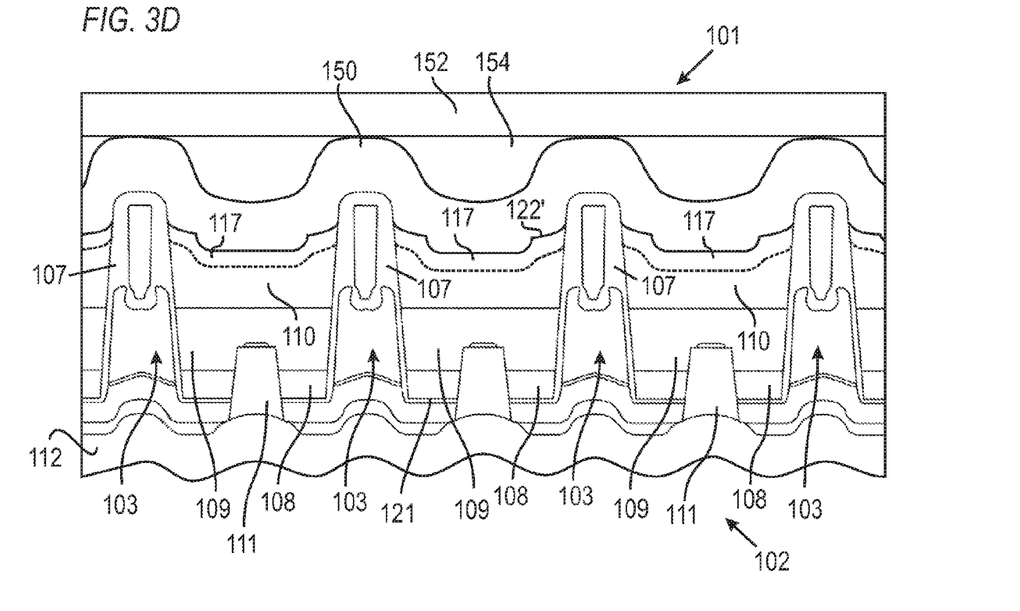

Finally, the back metallization 150 is formed, and the semiconductor substrate 102 soldered to a lead frame 154 with its back metallization 150 as described in conjunction with FIG. 2H.

With reference to FIG. 4A to 4D another embodiment is described. This embodiment is similar to the embodiment described in conjunction with FIGS. 2A to 2H but illustrates the manufacturing of a power device including trenches arranged at a small cell pitch (dense trench concept). The lateral spacing between adjacent trench structures is significantly reduced in comparison with the embodiment illustrated in FIG. 2A to 2H. In addition to that, no plugs are formed in the mesa structures 118. For contacting the mesa structures 118 and the source regions 108, possible insulating layers are removed from the first surface 121 of the semiconductor substrate so that the upper ends of the mesa structures 118 are exposed. Since the semiconductor substrate 102 is illustrated up-side down in FIG. 4A, the upper ends of the mesa structures 118 face down.

Figure 4A:
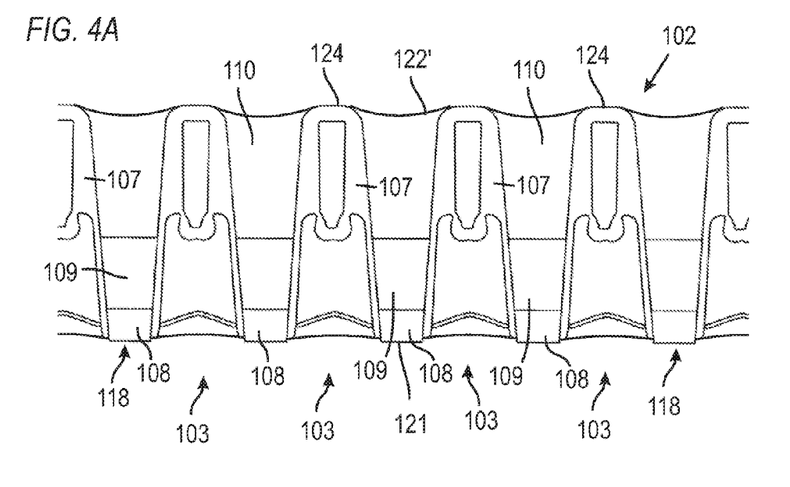
FIGS. 4A to 4D illustrate processing steps of a manufacturing method according to a third embodiment.

Similar to FIGS. 2A to 2B, the semiconductor substrate 102 is thinned, as illustrated in FIG. 4A, at its second surface 122 by a CMP process which stops at bottoms 124 of the trench structures 103.

Figure 4B:
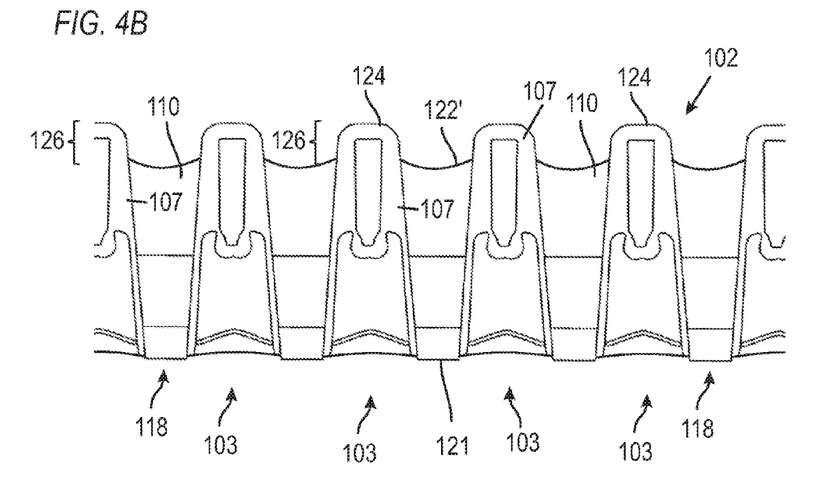

Then the semiconductor substrate 102 is selectively etched with respect to the trench structures 103 to expose bottom portions 126 of the trench structures 103 as illustrated in FIG. 4B. The bottom portions 126 projects above the processed second surface 122'.

Figure 4C:
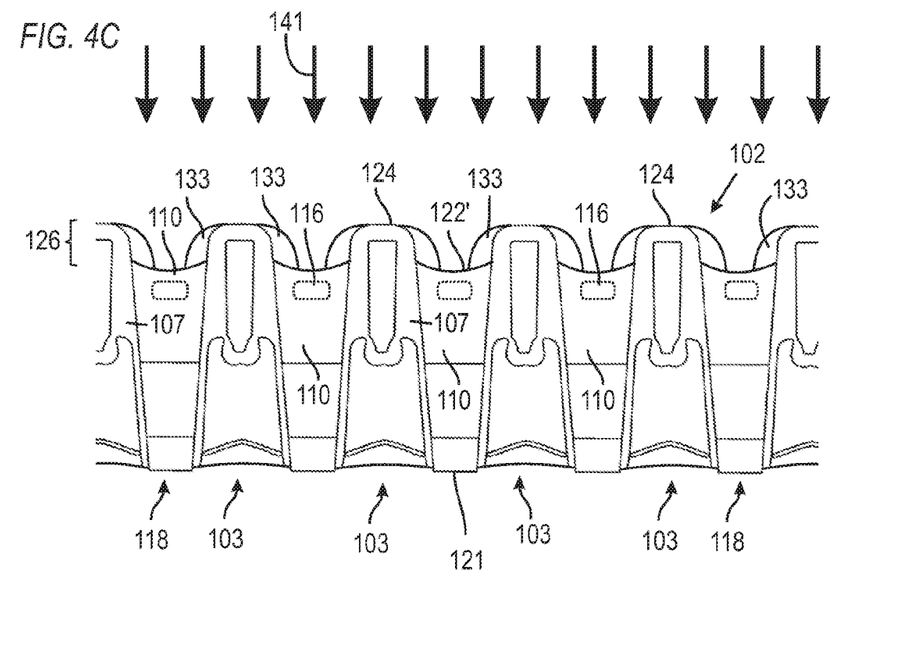

As illustrated in FIG. 4C, first mask 131 is then formed as described in conjunction with FIG. 2D by conformally depositing a mask layer which is subsequently anisotropically etched to obtain spacers 131 on exposed sidewalls of the bottom portions 126 of the trench structures 103. Typically, the spacers 131 form a hard mask.

Then a first dopant 141 (comparable to the first dopant 141) of the first conductivity type is implanted as described above to form doping regions 116 in the drift regions 110 close to the processed second surface 122'. The doping regions 116 are arranged between, and spaced to, the trench structures 103. The resulting structure is illustrated in FIG. 4C.

As it becomes apparent from FIG. 4C, the doping regions 116 have a smaller lateral extension than the doping regions 116 of FIG. 2E. Again, the location of the doping regions 116 are centrally adjusted with respect to the trench structures 103 and therefore to the structures at the first surface 121.

In this embodiment, a second mask is not formed different to the embodiment of FIGS. 2A to 2H. A skilled person will, however, appreciate that a second mask can also be formed if desired.

After removal of the first mask 131, a second dopant (comparable to the second dopant of FIG. 2F) of the first conductivity type is implanted to form the field stop regions 117 at the processed second surface 122'.

Additionally or alternatively, a third dopant of the second conductivity type can be implanted to form emitter regions at the processed second surface 122' if the formation of an IGBT is desired.

Figure 4D:
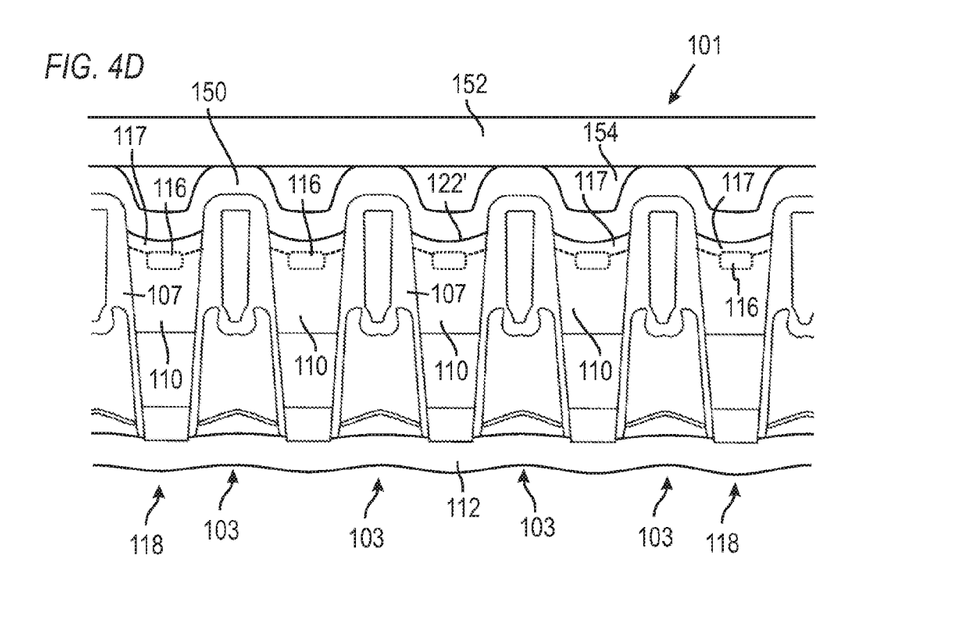

Finally, as illustrated in FIG. 4D, the back metallization 150 is formed and the semiconductor substrate 102 soldered to a lead frame 152 as described above. In addition to that, the front metallization 112 is formed on the first surface 121 for contacting the mesa structures 118. It goes without saying that the front metallization 112 can also be formed prior to the formation of the doping regions 116.

To summarise, the above described embodiments of the method for manufacturing a semiconductor device provide the effect that doping regions can be formed at the second surface in a self-adjusted manner to the structures at the first surface by using a mask which is formed in a self-aligned manner with respect to the trench structures. The method is suitable for semiconductor devices with deep trenches penetrating the drift region of the devices. The method includes a process for reducing the thickness of the semiconductor material at the second surface which also improves the dissipation of heat from the device to appropriate structures such as the lead frame. Another effect is that the doping regions are formed from the second surface and that a deep implantation into the first surface or an "early" formation during the manufacturing process can be avoided. This reduces the adverse influence of thermal processes on the doping profile of the doping regions. The doping regions can therefore be formed in a well defined manner which improves the device characteristics. Furthermore, the doping regions can be formed with a high spatial resolution, and have a small size with respect to the lateral cell size or cell pitch. The doping regions are arranged in those portions of the semiconductor substrate, such as the drift region, in which a high electrical field occurs during reverse state.

Moreover, the above described formation of the doping regions is applicable for devices of the dense-trench-concept to restrict the avalanche breakdown to an area which is laterally spaced from the trench structures while keeping the avalanche breakdown remote from the body regions. The avalanche breakdown occurs at the additional doping regions which therefore "pin" the location of the avalanche breakdown.

The written description above uses specific embodiments to disclose the invention, including the best mode, and also to enable any person skilled in the art to make and use the invention. While the invention has been described in terms of various specific embodiments, those skilled in the art will recognise that the invention can be practiced with modification within the spirit and scope of the claims. Especially, mutually non-exclusive features of the embodiments described above may be combined with each other. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for manufacturing a semiconductor device, comprising:
    providing a semiconductor substrate comprising a first surface and a second surface which is arranged opposite to the first surface, the semiconductor substrate comprising a plurality of trench structures extending from the first surface into the semiconductor substrate;
    reducing the thickness of the semiconductor substrate by removing semiconductor material at the second surface to obtain a processed second surface with exposed bottom portions of the trench structures;
    forming at least a first mask on the processed second surface in a self-aligned manner with respect to the bottom portions of the trench structures; and
    forming doping regions in the semiconductor substrate between the trench structures.

2. The method of claim 1, wherein the process of forming doping regions comprises implanting a dopant into the semiconductor material at the processed second surface.

3. The method of claim 2, wherein the process of implanting the dopant comprises using at least the first mask for implanting the dopant.

4. The method of claim 1, wherein the process of reducing the thickness of the semiconductor substrate comprises performing a chemical-mechanical polishing of the semiconductor material selectively to the trench structures such that the chemical-mechanical polishing stops at the bottoms of the trench structures.

5. The method of claim 4, wherein the process of reducing the thickness of the semiconductor substrate comprises etching selectively the semiconductor material with respect to the trench structures to expose the bottom portions of the trench structures, the semiconductor substrate being selectively etched after the chemical-mechanical polishing.

6. The method of claim 1, wherein the process of forming a first mask comprises forming spacers on exposed sidewalls of the exposed bottom portions.

7. The method of claim 1, further comprising:
    forming a second mask on the processed second surface for covering selected portions of the semiconductor substrate.

8. The method of claim 7, wherein the process of implanting the dopant comprises using the first and second masks for implanting the dopant.

9. The method of claim 1, further comprising:
    implanting a further dopant into the semiconductor substrate at the processed second surface.

10. The method of claim 9, wherein the process of implanting a further dopant is performed after removal of the first mask.

11. The method of claim 1, further comprising:
    etching selectively the semiconductor material at the processed second surface with respect to the first mask; and
    removing the first mask before the formation of the doping regions.

12. The method of claim 1, further comprising:
    forming a metallization at the processed second surface.

13. The method of claim 1, wherein each of the trench structures comprises a field plate which is insulated from the semiconductor material by an insulating layer.

14. A method for manufacturing a semiconductor device, comprising:
    providing a semiconductor substrate comprising a first surface and a second surface which is arranged opposite to the first surface, the semiconductor substrate comprising a plurality of trench structures extending from the first surface into the semiconductor substrate;
    reducing the thickness of the semiconductor substrate by removing semiconductor material at the second surface to obtain a processed second surface with exposed bottom portions of the trench structures;
    forming at least a first mask on the processed second surface in a self-aligned manner with respect to the bottom portions of the trench structures;
    implanting a first dopant into the semiconductor material at the processed second surface to form doping regions between the trench structures;
    removing the first mask; and
    implanting a second dopant into the semiconductor substrate at the processed second surface.

15. The method of claim 14, wherein the process of reducing the thickness of the semiconductor substrate comprises:
    performing a chemical-mechanical polishing of the semiconductor material; and
    etching selectively the semiconductor material with respect to the trench structures.

16. The method of claim 14, wherein the process of forming a first mask comprises forming spacers on exposed sidewalls of the exposed bottom portions.

17. The method of claim 14, wherein forming at least a first mask on the processed second surface is done without requiring lithographical definition.

18. A method for manufacturing a semiconductor device, comprising:

providing a semiconductor substrate comprising a first surface and a second surface which is arranged opposite to the first surface, the semiconductor substrate comprising a plurality of trench structures extending from the first surface into the semiconductor substrate;

reducing the thickness of the semiconductor substrate by removing semiconductor material at the second surface to obtain a processed second surface with exposed bottom portions of the trench structures;

forming at least a first mask on the processed second surface in a self-aligned manner with respect to the bottom portions of the trench structures;

etching selectively the semiconductor material at the processed second surface with respect to the first mask;

removing the first mask; and implanting a dopant into the semiconductor material at the processed second surface to form doping regions between the trench structures.

19. The method of claim 18, wherein the process of reducing the thickness of the semiconductor substrate comprises:

performing a chemical-mechanical polishing of the semiconductor material; and etching selectively the semiconductor material with respect to the trench structures.

20. The method of claim 18, wherein the process of forming a first mask comprises forming spacers on exposed sidewalls of the exposed bottom portions.

* * * * *